United States Patent [19]
Baldwin et al.

[11] Patent Number: 6,111,737
[45] Date of Patent: Aug. 29, 2000

[54] INTERNAL VOLTAGE PROTECTION CIRCUIT

[75] Inventors: David J. Baldwin, Allen; Ross E. Teggatz, McKinney; John H. Carpenter, Jr., Rowlett; Joseph A. Devore, Richardson, all of Tex.

[73] Assignee: Texas Instruments Incorporated, Dallas, Tex.

[21] Appl. No.: 09/267,490

[22] Filed: Mar. 11, 1999

Related U.S. Application Data

[60] Provisional application No. 60/080,074, Mar. 31, 1998.

[51] Int. Cl.[7] .................................................. H02H 3/20
[52] U.S. Cl. ...................... 361/91.1; 361/91.6; 361/18; 361/111
[58] Field of Search ................................ 361/91.1, 91.6, 361/18, 111; 323/265, 274, 282, 284; 307/10.1

[56] References Cited

U.S. PATENT DOCUMENTS

| | | | |
|---|---|---|---|
| 5,032,742 | 7/1991 | Zanders | 307/296.5 |
| 5,347,185 | 9/1994 | Tailliet | 307/540 |
| 5,438,213 | 8/1995 | Tailliet | 257/360 |
| 5,444,591 | 8/1995 | Chokhawala et al. | 361/18 |
| 5,581,432 | 12/1996 | Wellnitz et al. | 361/56 |
| 5,963,407 | 10/1999 | Fragapane et al. | 361/42 |

OTHER PUBLICATIONS

Rountree et al., "NMOS Protection Circuitry," *IEEE Transactions on Electronic Devices*, vol. ED–32, No. 5, May 1985, pp. 910–917.

Duvvury et al, "ESD: A Pervasive Reliability Concern for IC Technologies," *Proceedings of the IEEE*, vol. 81, No. 5, May 1993, pp. 690–702.

Welsher et al., "Design for Electrostatic–Discharge (ESD) Protection in telecommunications Products," *AT&T Technical Journal*, May/Jun. 1990.

Greason et al., "The Effects of Electrostatic Discharge on Microelectronic Devices—A Review," *IEEE Transactions on Industry Applications*, vol. 1A–20, No. 2, Mar./Apr. 1984, pp. 247–252.

Amerasekera et al., "ESD in Integrated Circuits," *Quality and Reliability Engineering International*, vol. 8, 259–272 (1992), Feb. 1992.

Avery, "A Review of Electrostatic Discharge Mechisms and On–Chip Protection Techniques to Ensure Device Reliability," *Journal of Electrostatics*, 24 (1990), pp. 111–130. (No Month).

*Primary Examiner*—Michael J. Sherry
*Attorney, Agent, or Firm*—J. Dennis Moore; Wade James Brady, III; Frederick J. Telecky, Jr.

[57] ABSTRACT

An internal circuitry protection scheme which protects on-IC circuitry when an external regulator voltage pin is shorted to a higher voltage. The circuit prevents damage to the on-die circuitry that is on the internal voltage rail, by clamping the received voltage, thereby eliminating the chance of damaging the on die circuitry. The circuit offers protection even if the voltage difference is large, but the difference remains small between the internal rail and the external regulated voltage under normal operation.

41 Claims, 4 Drawing Sheets

INTERNAL VOLTAGE PROTECTION CIRCUIT

This application claims priority under 35 USC § 119(e)(1) of provisional application number 60/080,074 filed Mar. 31, 1998.

BACKGROUND AND SUMMARY OF THE INVENTION

The present invention relates to integrated circuit protection methods, and in particular to methods to protect integrated circuits from external overvoltage.

ESD Protection

In MOS integrated circuits, the inputs are normally connected to drive the gate of one or more MOS transistors. (The term "MOS" is used in this application, as is now conventional, to refer to any insulated-gate-field-effect-transistor (IGFET), or to integrated circuits which include such transistors.) A longstanding problem is that electrostatic discharges (or similar externally generated voltage transients) may break down the thin gate oxide. Once the gate oxide has thus been punctured, the transistor may be permanently damaged. Thus, it has long been conventional to use protection devices on the input pins of MOS integrated circuits. Such protection devices are designed to avalanche (passing a large amount of current, and dissipating the energy of the incoming transient) before the voltage on the input pin can reach levels which would damage the gate oxide.

A variety of device structures for protecting integrated circuits against electrostatic discharge have been proposed. See, e.g., the following articles, and references cited therein, all of which are incorporated by reference:

Duvvury et al., "ESD: a pervasive reliability concern for IC technologies gies," 81 PRoc. IEEE 690 (1993); Amerasekera et al., "ESD in integrated circuits," 8 QUALITY AND RELIABILITY ENGINEERING INTERNATIONAL 259 (1992); Welsher et al., "Design for electrostatic—discharge (ESD) protection in telecommunications products, " 69 AT&T TECHNICAL JOURNAL 77 (1990); Avery, "A review of electrostatic discharge mechanisms and on-chip protection techniques to ensure device reliability," 24 J. ELECTROSTATICS 111 (1990); Greason et al., "The effects of electrostatic discharge on microelectronic devices—a review," 20 IEEE TRANSACTIONS ON INDUSTRY APPLICATIONS 247 (1984); R. N. Rountree and C. L. Hutchins, "NMOS protection circuitry, " IEEE *Trans. Electron Devices*, vol. ED-32, pp. 910–917, May 1985; U.S. Pat. No. 5,032,742 (Zanders), "ESD circuit for input which exceeds power supplies in normal operation;" U.S. Pat. No. 5,347,185 (Tailliet), "Protection Structure Against Latch-Up in a CMOS Circuit;" U.S. Pat. No. 5,438,213 (Tailliet), "General Protection of an Integrated Circuit against Permanent Overloads and Electrostatic Discharges;" the entire annual proceedings of the International Reliability Physics Symposia ("IRPS") for years 1980 to date; and the entire annual proceedings of the EOS/ESD symposia for years 1979 to date.

Overvoltage from External Voltage Sources

A similar problem arises in systems using multiple voltage levels. For example, an automotive system may use a system/battery power source which is nominally ~14V (and may, for a short time, go as high as ~40V), but have internal components which use a regulated power source of 3.3V or 5V. In these cases, there is a risk not only of typical ESD, but that any external pin of the regulated lower-voltage system will be inadvertently shorted to the higher voltage. If this occurs, there is a significant risk of damage to the low-voltage components. To prevent this, it is preferable that an overvoltage protection circuit be integrated into the low-voltage system.

The primary problem with most current overvoltage protection schemes is the use of a diode, as in prior art FIG. 3A. This diode can cause significant voltage difference between the regulated rail and the internal rail, which could then lead to interface situations and voltage headroom problems.

Another known solution is to shunt a zener clamping diode with the internal rail, but this would need a current limiting resistor, as shown in FIG. 3B. The required resistor would also contribute to a significant voltage difference between the regulated rail and the internal rail, depending on the current passed. Both prior solutions would make it impossible to meet a low drop out specification, where the circuit output is desired to be very close to the regulated voltage input.

Innovative Internal Voltage Protection Circuit

The present application discloses an internal circuitry protection scheme which protects on-IC circuitry when an external regulator voltage pin is shorted to a higher voltage. The disclosed circuit prevents damage to the on-die circuitry that is on the internal voltage rail, by clamping the received voltage, thereby eliminating the chance of damaging the on-die circuitry. The disclosed circuit offers protection even if the voltage difference is large, but the difference remains small between the internal rail and the external regulated voltage under normal operation. This circuit is cost effective in its additional area requirements, and meets customer requirements. This circuit also works as a passive protection device, reducing the possibility for damage while unpowered.

Advantages of the disclosed methods and structures include:

Improved voltage regulator protection for on die circuitry.

Reduced die area vs. some prior solutions.

Low quiescent current.

Flexible for circuit adjustment.

Minimum difference under normal conditions.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
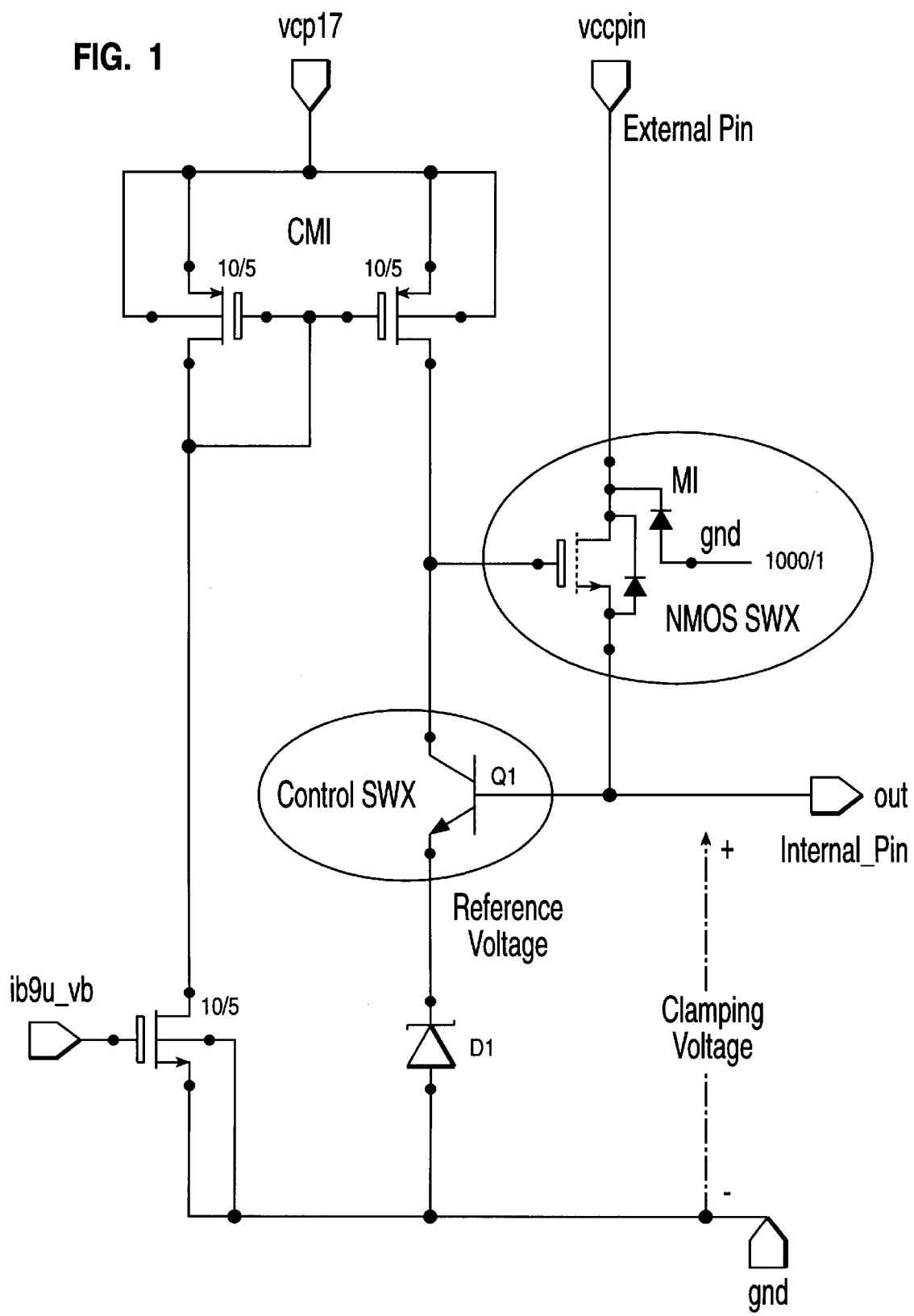
FIG. 1 shows an overvoltage protection circuit according to the preferred embodiment.

As shown in FIG. 1, an NMOS M1 switch is used to pass the voltage below a certain level and then to clamp the output on this source follower. The IB9U-VB line in this Figure is an external reference voltage, preferably mirrored from the gate of some other NMOS transistor somewhere else on the chip which is passing a precision reference current.

Figure 4:
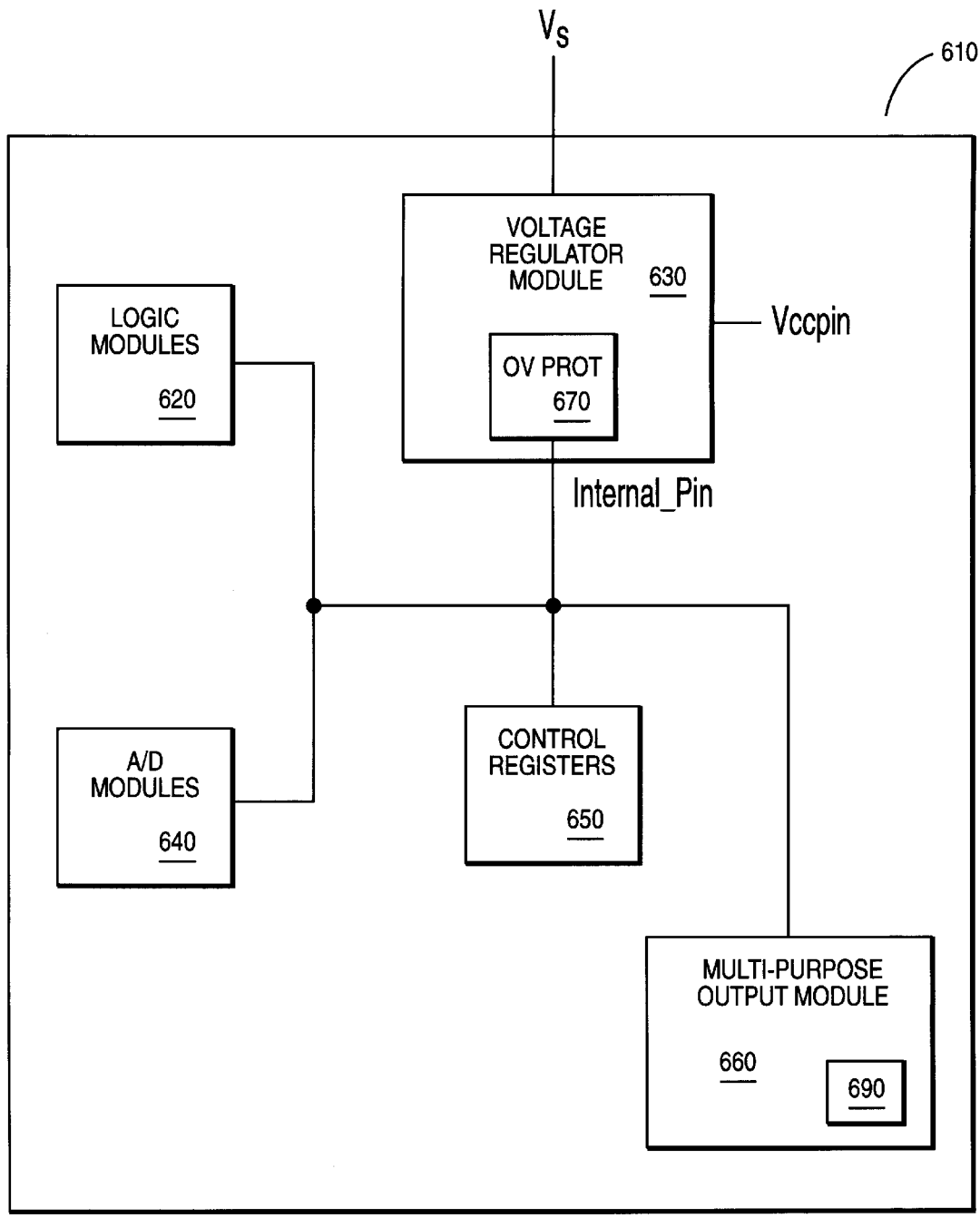
FIG. 4 shows a typical control chip which utilizes the preferred overvoltage protection circuit.

Vccpin is preferably 5V, generated by an on-chip regulated voltage generator from a ~13V input (as shown in FIG. 4, described below). Supply VCP17 is a higher voltage supply, and controls the gate of M1. A relatively high voltage at VCP17 avoids a voltage drop due to the threshold voltage ($V_T$) of M1. VCP17 is a pumped voltage generated on chip, using a regulated voltage doubler circuit to double the 13V source and regulate it down to a nominal 17V. Because VCP17 and Vccpin preferably originate from the 13V voltage source, both will be active at the same time.

As shown in the preferred embodiment of FIG. 1, NMOS switch M1 operates as a source follower, and is the basic regulating element between the positive internal line and the external pin Vccpin. D1 is a reference diode, which in the preferred embodiment is a reverse biased zener reference diode.

During steady state operation, if the internal voltage experiences a transient rise, then NPN bipolar Q1 will turn on more strongly, pass more current from current source CM1 to the reference diode D1, and thereby reduce the gate voltage of the transistor M1. This in turn will reduce the current source to the internal supply line and hence lower its voltage. In the preferred embodiment, the diode D1 produces a reference voltage of 6.6V, which therefore produces a clamping voltage of ~7.5V when Q1 is fully turned on.

Conversely, if the internal supply voltage begins to drop slightly, Q1 will pass less current, and hence current mirror CM1 will pull up the gate voltage of transistor M1. Thus, M1 would then pass more current and pull the internal supply voltage back closer to Vccpin (5V).

The preferred embodiment is used in an automotive system, in a control chip as shown in FIG. 4. The automotive system generates an unregulated power supply voltage $V_s$, from the battery or alternator, at ~13 V. Voltage regulator module 630 receives this unregulated voltage, and produces both Vccpin and VCP17, which are passed to a circuit as in FIG. 1, shown in this figure as block OVPROT 670 in voltage regulator module 630. As shown in FIG. 1, OVPROT produces a protected, regulated 5V output at Internal_Pin.

In this automotive system, the on-chip modules 620, 640, 650, 660 are powered by a connection to Internal_Pin. This circuit is connected between the 5V regulated voltage output, at Vccpin, and the power inputs of the other on-chip circuits, which are connected to the Internal_Pin output. Vccpin is also accessible on an external pin, so off-chip devices may be powered by the regulated voltage. This circuit is therefore used, in the preferred embodiment, to protect other on-chip circuits in case external pin Vccpin is shorted to a higher voltage, such as the automotive system voltage of ~13V. When this occurs, the Internal_Pin output will rise with Vccpin until it reaches a given voltage, where it is then clamped. The clamping voltage is determined by diode D1. By clamping the output, the other on-chip circuits are protected.

Typical device sizes for the MOS devices are shown in FIG. 1. e.g. 1000/1 for M1 and 10/5 for the other MOS transistors. Q1 and the reference diode D1 are both minimal devices.

Figure 2:
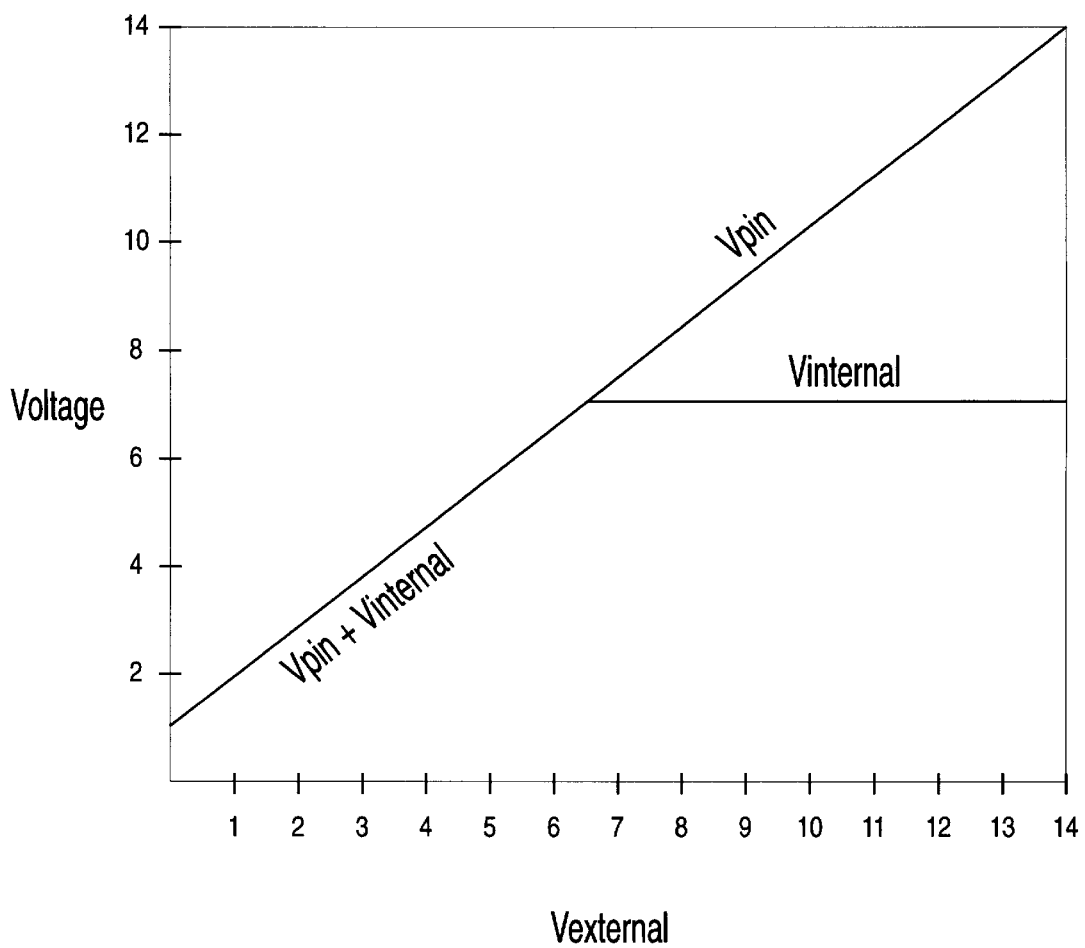
FIG. 2 shows a graph of the voltage of the internal rail according to the external voltage.
Figure 3A:
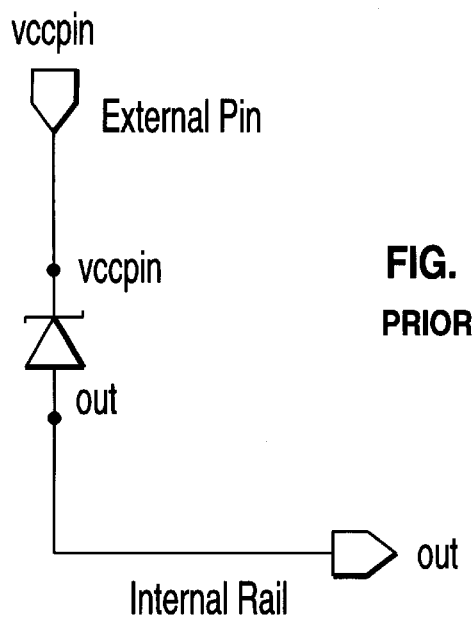
FIGS. 3*a* and 3*b* show prior art protection circuits.
Figure 3B:
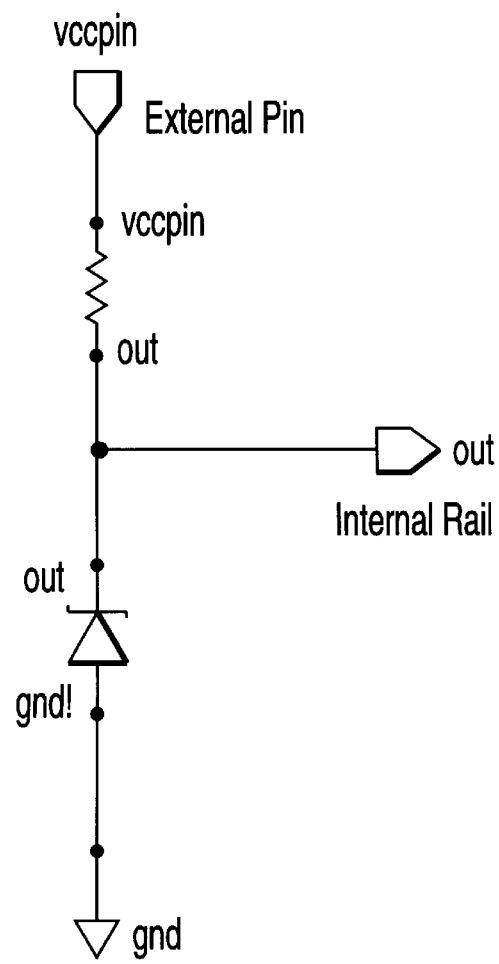

The preferred embodiment provides two significant advantages, among others: First, the regulated voltage is passed to the internal rail with little difference between them eliminating the interface problem. As shown in FIG. 2, output voltage Vinternal and Vpin increase with Vexternal. As Vexternal, and therefore Vpin, passes a fixed voltage point, e.g. ~7 volts, the output voltage Vinternal is clamped at that level, which is approximately equal to the reference voltage plus the Vbe of Q1. Excess voltage from Vccpin is then blocked.

Second, the clamping action of the source follower and the diode clamp provides additional protection to prevent damage from occurring to the on-die circuitry. This innovative circuit provides the protection required while still allowing the circuit to meet low drop-out specifications.

According to the presently preferred embodiment, the clamp operates at a higher than normal voltage. This allows some variation in Vexternal to pass through, while still protecting the internal circuitry.

Another characteristic of the preferred embodiment is the need to have a higher than output gate drive voltage. This higher gate voltage helps to provide the drive for the NMOS switch, keeping the difference between the rails small.

According to a disclosed class of innovative embodiments, there is provided an overvoltage protection circuit, comprising: a first switch connected between an external voltage input and a voltage output; a second switch connected between a charge voltage source and a reference voltage source, and connected to be controlled by said voltage output; wherein when the voltage at said external voltage input exceeds a predetermined limit, said first and second switches operate to produce an output voltage at said limit.

According to another disclosed class of innovative embodiments, there is provided an overvoltage protection circuit, comprising: a first switch connected between an external voltage input and a voltage output, and a control terminal connected to a charge voltage source at a first node; a second switch connected between a said first node and a reference voltage source, connected to be controlled by said voltage output; wherein when the voltage at said external voltage input exceeds a predetermined limit, determined by said reference voltage, said first switch passes less current and said second switch passes more current, to produce an output voltage at said limit.

According to another disclosed class of innovative embodiments, there is provided a voltage regulator circuit with overvoltage protection, comprising a power source providing an unregulated voltage; a voltage regulator circuit connected to receive said unregulated voltage and to produce a regulated voltage at a regulated voltage connection, and to produce a charged voltage at a charged voltage output; a first switch connected between said regulated voltage connection and a protected output; a second switch connected between said charge voltage output and a reference voltage source, and connected to be controlled by said protected output; wherein when the voltage at said regulated voltage connection exceeds a predetermined limit, said first and second switches operate to produce an output voltage at said limit.

According to another disclosed class of innovative embodiments, there is provided an automotive control system, comprising a power source providing an unregulated voltage; a voltage regulator circuit connected to receive said unregulated voltage and to produce a regulated voltage at a regulated voltage connection, and to produce a charged voltage at a charged voltage output; a first switch connected between said regulated voltage connection and a protected output; a second switch connected between said charge voltage output and a reference voltage source, and connected to be controlled by said protected output; at least one logic module connected to receive power from said protected output; wherein when the voltage at said regulated voltage connection exceeds a predetermined limit, said first and second switches operate to produce an output voltage at said limit.

According to another disclosed class of innovative embodiments, there is provided a method for protecting an integrated circuit from excessive voltage, comprising the steps of: receiving an external voltage; generating a reference voltage; while said external voltage is within a predetermined range, passing said external voltage through a first switch to a circuit output; when said external voltage exceeds said predetermined range, then applying said external voltage to the control terminal of a second switch; and using the current passed by said second switch to control said first switch, clamping said circuit output to a voltage determined by said reference voltage.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

For example, bipolar transistors may be replaced by MOS devices, and vice-versa, as long as the limitations of each type of device are considered. For example, if the bipolar transistor Control SWX were replaced with a MOS device, one of ordinary skill in the art would naturally consider the limitations of the oxide.

For another example, reference diode D1, which determines the reference voltage, could be replaced with any number of circuits which generate any required reference voltage.

What is claimed is:

1. An overvoltage protection circuit, comprising:
   a first switch connected between an external voltage input and a voltage output;
   a second switch connected between a charge voltage source and a reference voltage source, and connected to be controlled by said voltage output;
   wherein when the voltage at said external voltage input exceeds a predetermined limit, said first and second switches operate to produce an output voltage at said limit.

2. The circuit of claim 1, wherein said power source providing an unregulated voltage is an automotive battery.

3. The circuit of claim 1, wherein all elements, except said power source, are on a single integrated circuit.

4. The circuit of claim 1, wherein said regulated voltage connection is externally accessible.

5. The circuit of claim 1, wherein said limit is less than 8 volts.

6. The circuit of claim 1, wherein said charged voltage is at least two times said regulated voltage.

7. The circuit of claim 1, wherein said reference voltage is determined by a diode.

8. The circuit of claim 1, wherein said regulated voltage is 5 volts.

9. The circuit of claim 1, wherein said first switch is an NMOS transistor.

10. The circuit of claim 1, wherein said second switch is a bipolar transistor.

11. An overvoltage protection circuit, comprising:
    a first switch connected between an external voltage input and a voltage output, and a control terminal connected to a charge voltage source at a first node;
    a second switch connected between a said first node and a reference voltage source, connected to be controlled by said voltage output;
    wherein when the voltage at said external voltage input exceeds a predetermined limit, determined by said reference voltage, said first switch passes less current and said second switch passes more current, to produce an output voltage at said limit.

12. The circuit of claim 11, wherein said power source providing an unregulated voltage is an automotive battery.

13. The circuit of claim 11, wherein all elements, except said power source, are on a single integrated circuit.

14. The circuit of claim 11, wherein said regulated voltage connection is externally accessible.

15. The circuit of claim 11, wherein said limit is less than 8 volts.

16. The circuit of claim 11, wherein said charged voltage is at least two times said regulated voltage.

17. The circuit of claim 11, wherein said reference voltage is determined by a diode.

18. The circuit of claim 11, wherein said regulated voltage is 5 volts.

19. The circuit of claim 11, wherein said first switch is an NMOS transistor.

20. The circuit of claim 11, wherein said second switch is a bipolar transistor.

21. A voltage regulator circuit with overvoltage protection, comprising:
    a power source providing an unregulated voltage;
    a voltage regulator circuit connected to receive said unregulated voltage and to produce a regulated voltage at a regulated voltage connection, and to produce a charged voltage at a charged voltage output;
    a first switch connected between said regulated voltage connection and a protected output;
    a second switch connected between said charge voltage output and a reference voltage source, and connected to be controlled by said protected output;
    wherein when the voltage at said regulated voltage connection exceeds a predetermined limit, said first and second switches operate to produce an output voltage at said limit.

22. The circuit of claim 21, wherein said power source providing an unregulated voltage is an automotive battery.

23. The circuit of claim 21, wherein all elements, except said power source, are on a single integrated circuit.

24. The circuit of claim 21, wherein said regulated voltage connection is externally accessible.

25. The circuit of claim 21, wherein said limit is less than 8 volts.

26. The circuit of claim 21, wherein said charged voltage is at least two times said regulated voltage.

27. The circuit of claim 21, wherein said reference voltage is determined by a diode.

28. The circuit of claim 21, wherein said regulated voltage is 5 volts.

29. The circuit of claim 21, wherein said first switch is an NMOS transistor.

30. The circuit of claim 21, wherein said second switch is a bipolar transistor.

31. An automotive control system, comprising:
    a power source providing an unregulated voltage;

a voltage regulator circuit connected to receive said unregulated voltage and to produce a regulated voltage at a regulated voltage connection, and to produce a charged voltage at a charged voltage output;

a first switch connected between said regulated voltage connection and a protected output;

a second switch connected between said charge voltage output and a reference voltage source, and connected to be controlled by said protected output;

at least one logic module connected to receive power from said protected output;

wherein when the voltage at said regulated voltage connection exceeds a predetermined limit, said first and second switches operate to produce an output voltage at said limit.

32. The system of claim 31, wherein said power source providing an unregulated voltage is an automotive battery.

33. The system of claim 31, wherein all elements, except said power source, are on a single integrated circuit.

34. The system of claim 31, wherein said regulated voltage connection is externally accessible.

35. The system of claim 31, wherein said limit is less than 8 volts.

36. The system of claim 31, wherein said charged voltage is at least two times said regulated voltage.

37. The system of claim 31, wherein said reference voltage is determined by a diode.

38. The system of claim 31, wherein said regulated voltage is 5 volts.

39. The system of claim 31, wherein said first switch is an NMOS transistor.

40. The system of claim 31, wherein said second switch is a bipolar transistor.

41. A method for protecting an integrated circuit from excessive voltage, comprising the steps of:

(a.) receiving an external voltage;

(b.) generating a reference voltage;

(c.) while said external voltage is within a predetermined range, passing said external voltage through a first switch to a circuit output;

(d.) when said external voltage exceeds said predetermined range, then
 (i.) applying said external voltage to the control terminal of a second switch; and
 (ii.) using the current passed by said second switch to control said first switch, clamping said circuit output to a voltage determined by said reference voltage.

* * * * *